(12) United States Patent
Choi

(10) Patent No.: US 6,492,825 B2
(45) Date of Patent: Dec. 10, 2002

(54) SOCKET AND PRINTED CIRCUIT BOARD FOR SEMICONDUCTOR DEVICE, AND METHOD OF TESTING SEMICONDUCTOR DEVICE

(75) Inventor: Jung-hwan Choi, Suwon (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/738,311

(22) Filed: Dec. 18, 2000

(65) Prior Publication Data

US 2001/0004216 A1 Jun. 21, 2001

(30) Foreign Application Priority Data

Dec. 20, 1999 (KR) .............................. 99/59440

(51) Int. Cl.[7] .............................................. G01R 31/02
(52) U.S. Cl. ..................... 324/755; 324/158.1
(58) Field of Search ................. 324/755–158.1, 324/754, 762; 439/71, 686, 331

(56) References Cited

U.S. PATENT DOCUMENTS 6,242,933 B1 * 6/2001 Yap .............................. 324/755

* cited by examiner

*Primary Examiner*—Michael Sherry
*Assistant Examiner*—Paresh Patel
(74) *Attorney, Agent, or Firm*—Volentine Francos, PLLC

(57) ABSTRACT

A socket and a printed circuit board for testing a semiconductor device packaged by a chip scaled package (CSP) method, and a semiconductor device testing method are provided. In order to test the semiconductor device packaged by a CSP method, the upper wall of the testing socket has a socket aperture formed to expose the pads of the semiconductor device to be tested to the outside of the testing socket. The testing socket may be mounted under the printed circuit board. The printed circuit board has a board aperture formed over the socket aperture. The pads of a semiconductor device are directly probed through both the socket aperture and the board aperture, so that the waveforms of a semiconductor device can be measured.

9 Claims, 7 Drawing Sheets

SOCKET AND PRINTED CIRCUIT BOARD FOR SEMICONDUCTOR DEVICE, AND METHOD OF TESTING SEMICONDUCTOR DEVICE

BACKGROUND OF THE INVENTION

1. Field of the Invention

The present invention relates to semiconductor devices, and more particularly, to a socket and a printed circuit board for semiconductor devices, and a method of testing semiconductor devices.

2. Description of the Related Art

Recent semiconductor devices operate at a high frequency band of several hundreds of MHz. In this high frequency band, the influence of the parasitic components of a semiconductor device package upon the operation of semiconductor devices increases. The parasitic components are resistance, inductance, and capacitance. To reduce these parasitic components, a chip scaled package (CSP) has been introduced The CSP is smaller than conventional plastic packages, so that the influence of the parasitic components of the CSP upon the operation of a semiconductor device is reduced.

A conventional CSP will now be described referring to FIGS. 1 and 2. FIG. 1 is a top plan view of a semiconductor device packaged by a conventional chip scaled package (CSP) method, and FIG. 2 is a cross-sectional view of the semiconductor device of FIG. 1 taken along line 2–2'.

A semiconductor device 11 is covered by a chip surface protective film 22 formed of polyamide or the like. In such a semiconductor device 11 packaged by a CSP method, balls 13 are connected to pads 15 via beam leads 17. The pads 15 are disposed in an area 19 that runs along the center of the semiconductor device 11, and the device is also covered by a tape 28 or the like.

Generally, the semiconductor device 11 packaged by the CSP method is mounted on a test socket to be tested. FIG. 3 is a top plan view of a conventional test socket, and FIGS. 4 and 5 are cross-sectional views of the test socket of FIG. 3 taken along lines 4–4' and 5–5', respectively.

Referring to FIGS. 3, 4 and 5, a conventional test socket 30 includes outer sidewalls 31 for fixing a semiconductor device 44 to be tested, an upper wall 45 and a lower supporting member 47. Also, the conventional test socket 30 includes ball contact springs 32, formed through the upper wall 45, which individually contact balls 43 connected to pads 53 via beam leads (not shown).

However, the semiconductor device 44 packaged by a CSP method has the balls 13 and the beam leads 17 formed thereon, as shown in FIGS. 1 and 2. Thus, even when a certain portion of the package is uncovered, the chip surface of the semiconductor device 44 cannot be directly accessed because of the balls 13 and the beam leads 17. Therefore, in contrast with general plastic packages, it is impossible to directly measure signal waveforms from the chip surface of a semiconductor device at a frequency where the semiconductor device operates.

SUMMARY OF THE INVENTION

To solve the above problem, it is an object of the present invention to provide a test socket capable of directly detecting waveforms from the chip surface of a semiconductor device packaged by a chip scaled package (CSP) method.

It is another object of the present invention to provide a printed circuit board (PCB) at which a test socket capable of directly detecting waveforms from the chip surface of a semiconductor device packaged by a CSP method is installed.

It is still another object of the present invention to provide a method of testing a semiconductor device capable of directly detecting waveforms from the chip surface of a semiconductor device packaged by a CSP method.

Accordingly, to achieve the first object, the present invention provides a socket for testing a semiconductor device, the socket including outer sidewalls, an upper wall and a lower support member for fixing the semiconductor device. The socket also includes ball contact springs, formed through the upper wall, which contact corresponding balls connected to the corresponding pads of a semiconductor device to be tested, and a socket aperture formed through the upper wall to expose the pads of the semiconductor device to the outside of the testing socket.

To achieve the second object, the present invention provides a printed circuit board at which a socket for testing a semiconductor device packaged by a CSP method is installed. The printed circuit board includes a board aperture formed over the socket aperture of the testing socket to expose the pads of a semiconductor device. Preferably, the upper wall of the testing socket is attached to the bottom of the printed circuit board. More preferably, the size and location of the socket aperture of the test socket are similar to those of the board aperture of the printed circuit board to expose the pads of a semiconductor device.

To achieve the third object, the present invention provides a method of testing a semiconductor device packaged by a CSP method, by which waveforms can be directly detected from the surface of a semiconductor device chip. The method includes: forming a socket aperture in a testing socket on which a semiconductor device to be tested is mounted; mounting the semiconductor device on the testing socket so that the pads of the semiconductor device are exposed through the socket aperture; forming a board aperture in a printed circuit board; attaching the testing socket to the bottom of the printed circuit board so that the socket aperture faces upward and is aligned vertically with the board aperture, whereby the pads of the semiconductor device are exposed through the socket aperture and the board aperture when the testing socket has been installed at the printed circuit board; and testing the semiconductor device through the board aperture and the socket aperture.

In the above-described devices and method of testing a semiconductor device, according to the present invention, the waveforms on the chip surface of a semiconductor device packaged by a CSP method can be directly detected.

BRIEF DESCRIPTION OF THE DRAWINGS

The above objects and advantages of the present invention will become more apparent by describing in detail preferred embodiments thereof with reference to the attached drawings in which.

DESCRIPTION OF THE PREFERRED EMBODIMENTS

Figure 1:
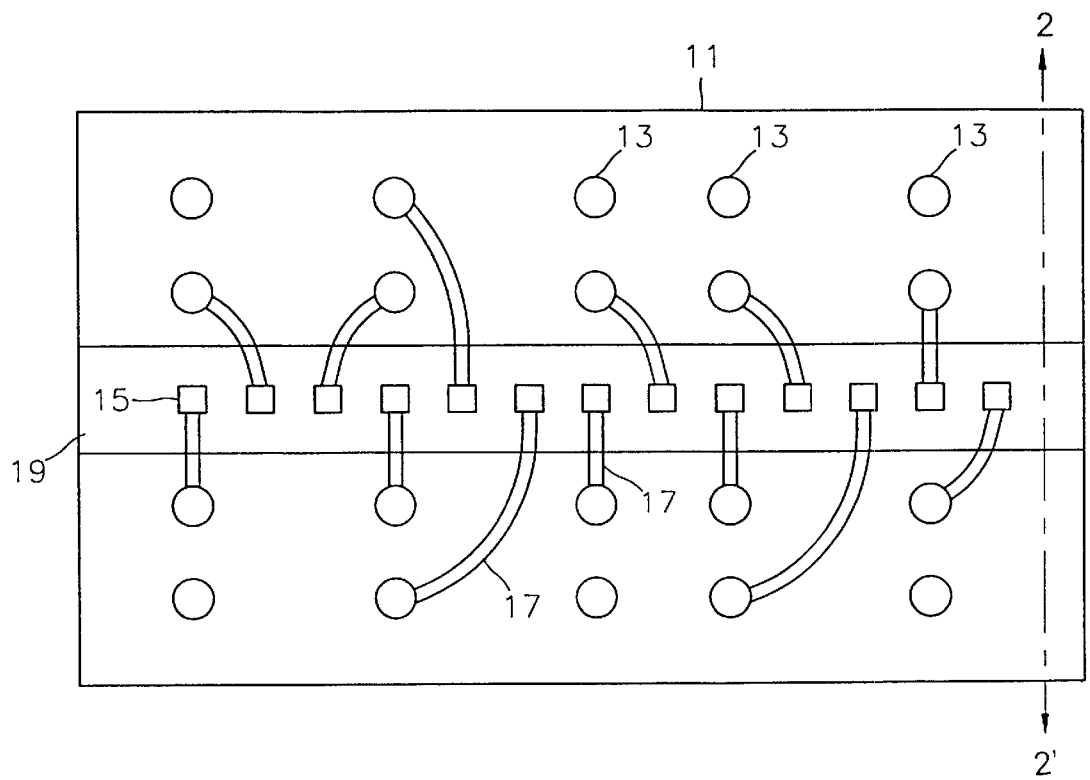
FIG. 1 is a top plan view of a semiconductor device packaged by a conventional chip scaled package (CSP) method.
Figure 2:
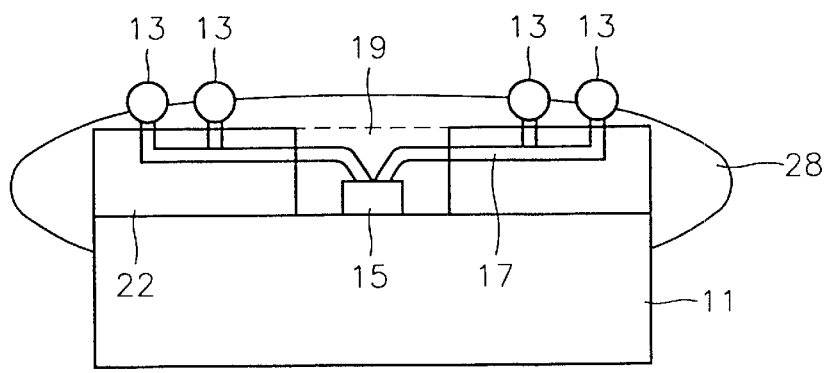
FIG. 2 is a cross-sectional view of the semiconductor device of FIG. 1 taken along line 2–2'.
Figure 3:
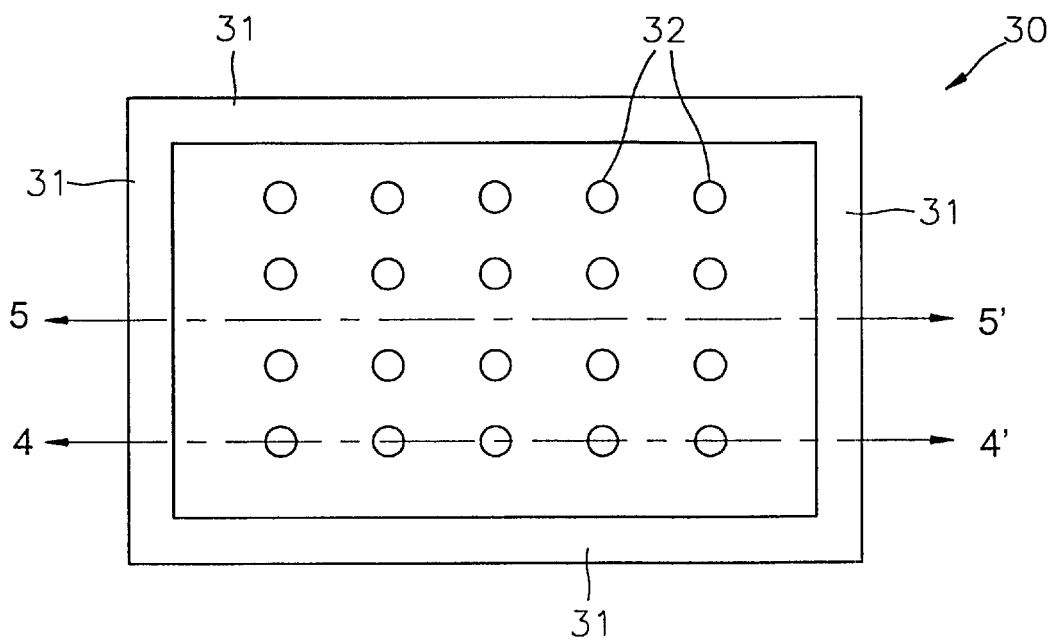
FIG. 3 is a top plan view of a conventional test socket.
Figure 4:
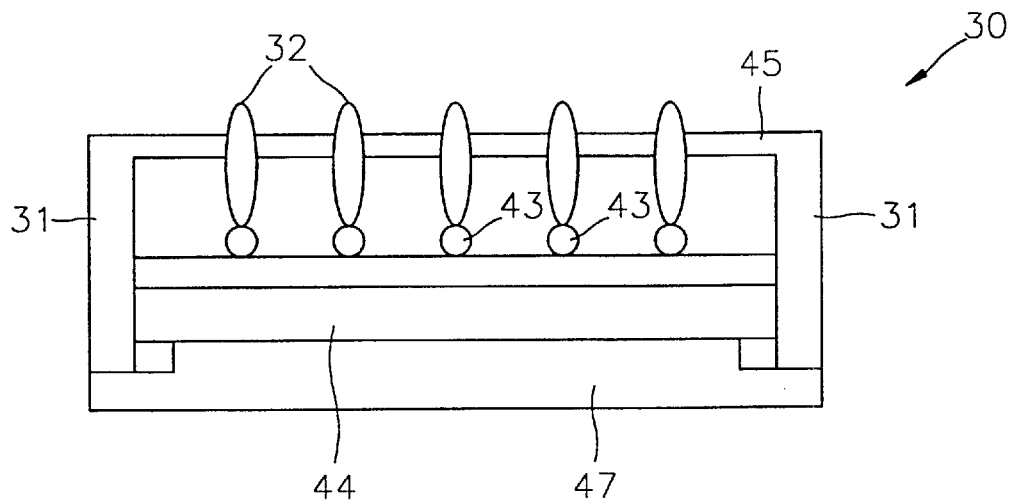
FIGS. 4 and 5 are cross-sectional views of the test socket of FIG. 3 taken along lines 4–4' and 5–5', respectively.
Figure 5:
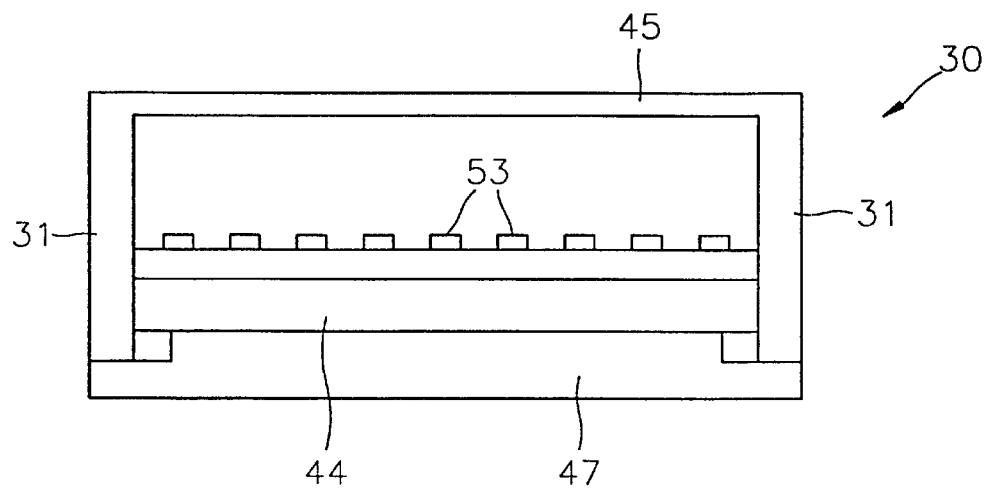

Hereinafter, the present invention will be described in detail by explaining preferred embodiments of the present invention with reference to the attached drawings. Like reference numerals in the drawings denote like elements.

Figure 6:
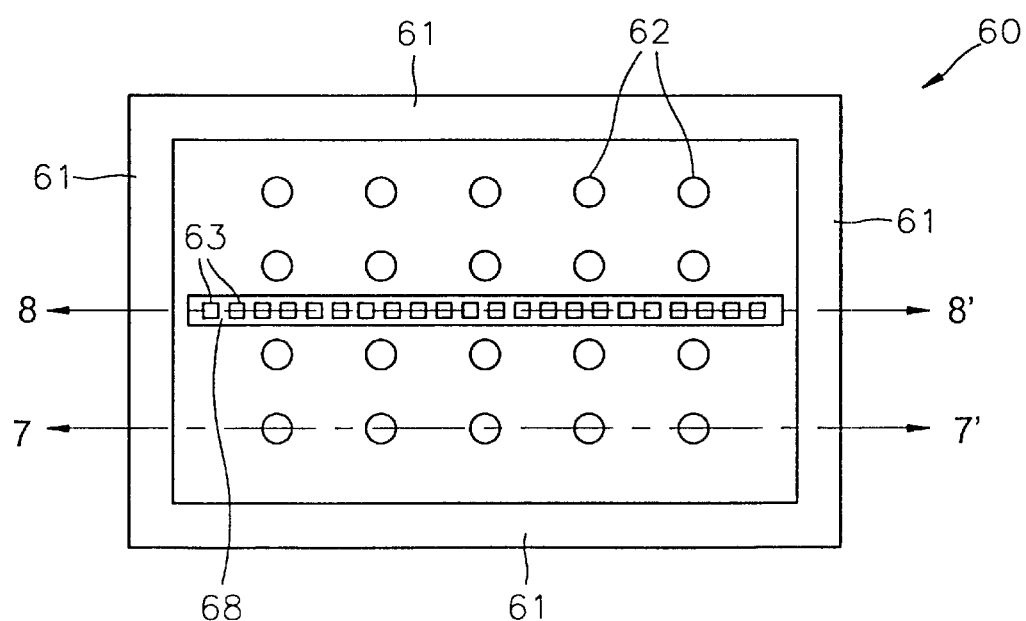
FIG. 6 is a top plan view of a test socket according to an embodiment of the present invention.
Figure 7:
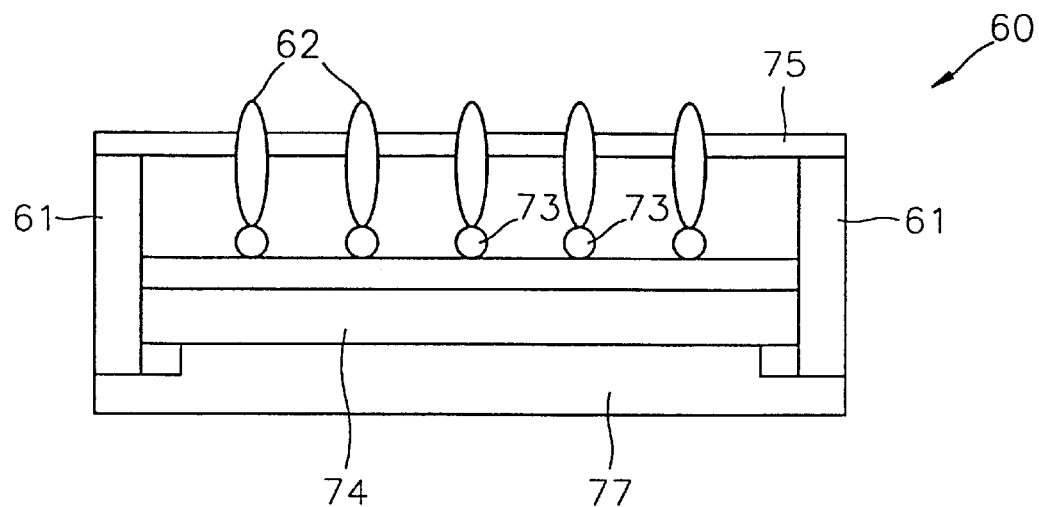
FIGS. 7 and 8 are cross-sectional views of the test socket of FIG. 6 taken along lines 7–7' and 8–8', respectively.
Figure 8:
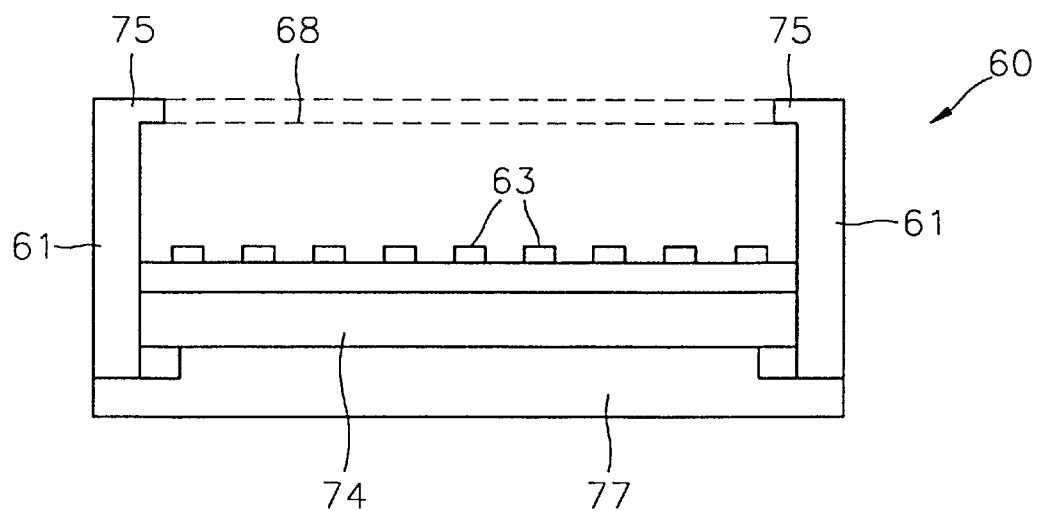

FIG. 6 is a top plan view of a test socket according to an embodiment of the present invention, and FIGS. 7 and 8 are cross-sectional views of the test socket of FIG. 6 taken along lines 7–7' and 8–8', respectively.

Referring to FIGS. 6 through 8, a semiconductor device testing socket 60 according to an embodiment of the present invention includes a lower support member 77, outer sidewalls 61 and an upper wall 75, and supports a semiconductor device 74 to be tested. The socket 60 also includes ball contact springs 62 formed through the upper wall 75. The ball contact springs 62 project downwardly and contact corresponding balls 73 connected to the corresponding pads 63 of the semiconductor device 74 to be tested, and apply signals to and discharge signals from the semiconductor device 74. The socket 60 further includes a socket aperture 68 formed through the upper wall 75 to expose the pads 63 of the semiconductor device 74 to be tested to the outside of the testing socket 60.

In the present specification, a protective film (not shown), such as a tape for protecting the entire body of the semiconductor device 74 packaged by a chip scaled package (CSP) method, will not be described for convenience of explanation.

The balls 73 of the semiconductor device are connected to the pads 63 via beam leads (not shown). The semiconductor device 74 to be tested is mounted on the lower support member 77 of the testing socket. The semiconductor device 74 mounted on the lower support member 77 is fixed by the outer sidewalls 61. Thus, the ball contact springs 62 formed through the upper wall 75 of the testing socket 60 contact the balls 73.

During testing, the ball contact springs 62 help the semiconductor device 74 to be easily mounted on the testing socket 60. Since the socket aperture 68 is formed through the upper wall 75 of the testing socket 60 to reveal the pads 63, the pads 63 of the semiconductor device 74 to be tested are exposed to the outside of the testing socket 60.

Beam leads (not shown) for bonding the pads 63 to the balls 73 are connected to the pads 63 at portions of the semiconductor device 74 where the pads 63 are located. Thus, when the package is chemically uncovered, the portions of the semiconductor device where the pads 63 are located are revealed. Hence, waveforms can be measured by directly probing the revealed pads 63 from the outside via the socket aperture 68. Thus, the socket aperture 68 must be located over the pads 63.

The reason why the waveforms on the surface of the semiconductor device 74 must be directly measured is that signals input/output via the ball contact springs 62 of the testing socket 60 can be affected by the inductance of the ball contact springs 62. Another reason why the waveforms on the surface of the semiconductor device 74 must be directly measured is to discern a case in which the testing socket 60 and the semiconductor device 74 are not smoothly connected to each other.

Figure 9:
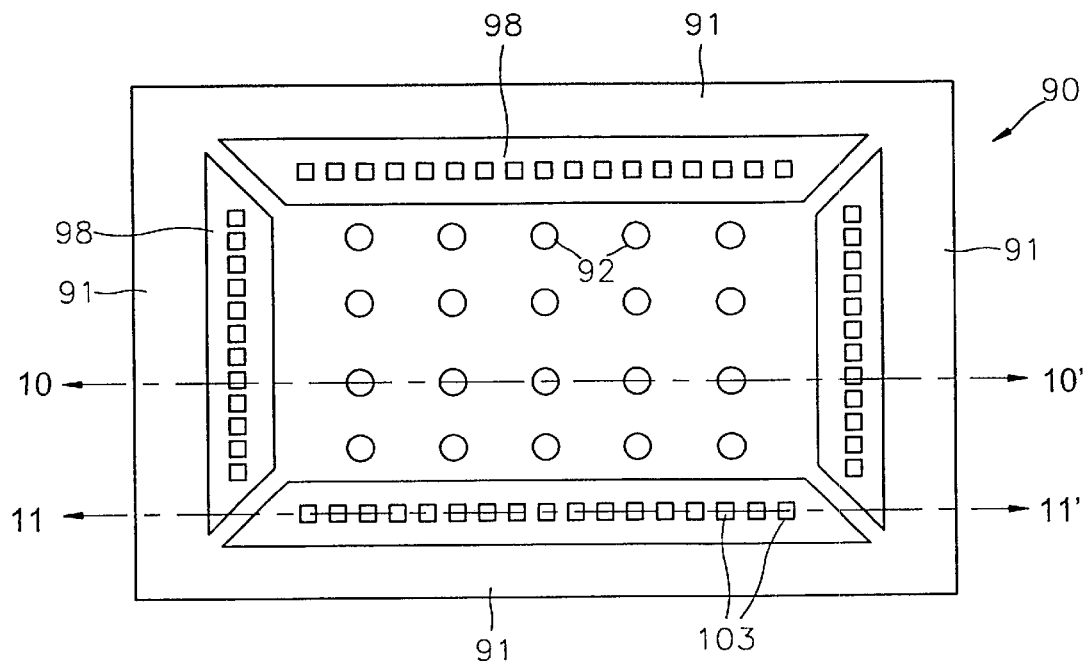
FIG. 9 is a top plan view of a test socket according to another embodiment of the present invention.
Figure 10:
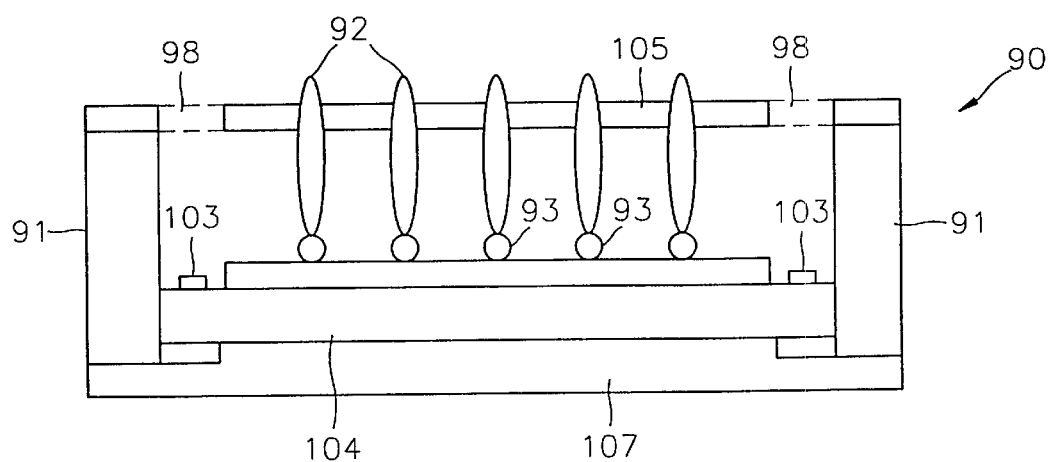
FIGS. 10 and 11 are cross-sectional views of the test socket of FIG. 9 taken along lines 10–10' and 11–11', respectively.
Figure 11:
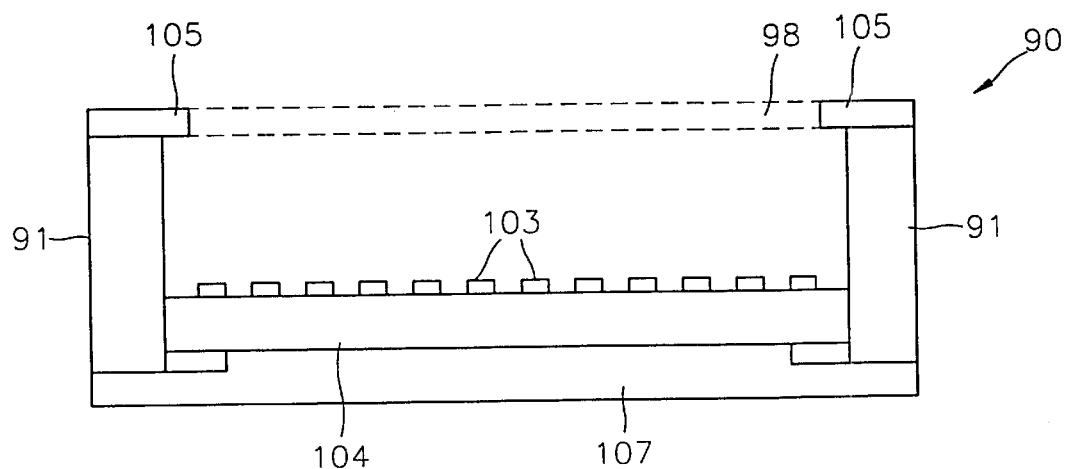

FIG. 9 is a top plan view of a semiconductor device testing socket 90 according to another embodiment of the present invention, and FIGS. 10 and 11 are cross-sectional views of the test socket 90 of FIG. 9 taken along lines 10–10' and 11–11', respectively.

Referring to FIGS. 9 through 11, the semiconductor device testing socket 90 includes a lower support member 107 for supporting a semiconductor device 104 to be tested, outer sidewalls 91 and an upper wall 105. The testing socket 90 also includes ball contact springs 92, formed through the upper wall 105, which contact corresponding balls 93, which are connected to the pads 103 of the semiconductor device 90 to be tested via beam leads (not shown). The testing socket 90 further includes a socket aperture 98 formed through the upper wall 105 to expose the pads 103 of the semiconductor device 104 to be tested to the outside of the testing socket 90.

The structure and operation of the testing socket 90 shown in FIGS. 9 through 11 are significantly similar to those of the testing socket 60 shown in FIGS. 6 through 8. The pads 63 of the semiconductor device 74 mounted on the testing socket 60 of FIGS. 6 through 8 are aligned across the center of the semiconductor device. By contrast, the pads 103 of the semiconductor device 104 mounted on the testing socket 90 of FIGS. 9 through 11 are aligned along the edges of the semiconductor device. Thus, FIGS. 9 through 11 will not be described in detail for convenience of explanation.

Figure 12:
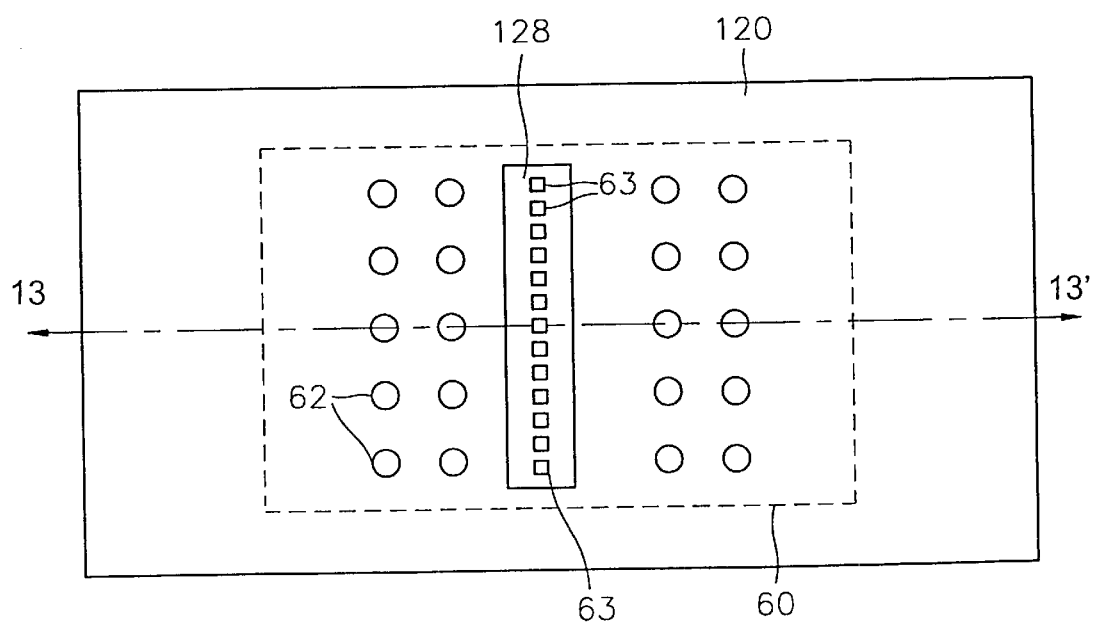
FIG. 12 is a top plan view of a printed circuit board.
Figure 13:
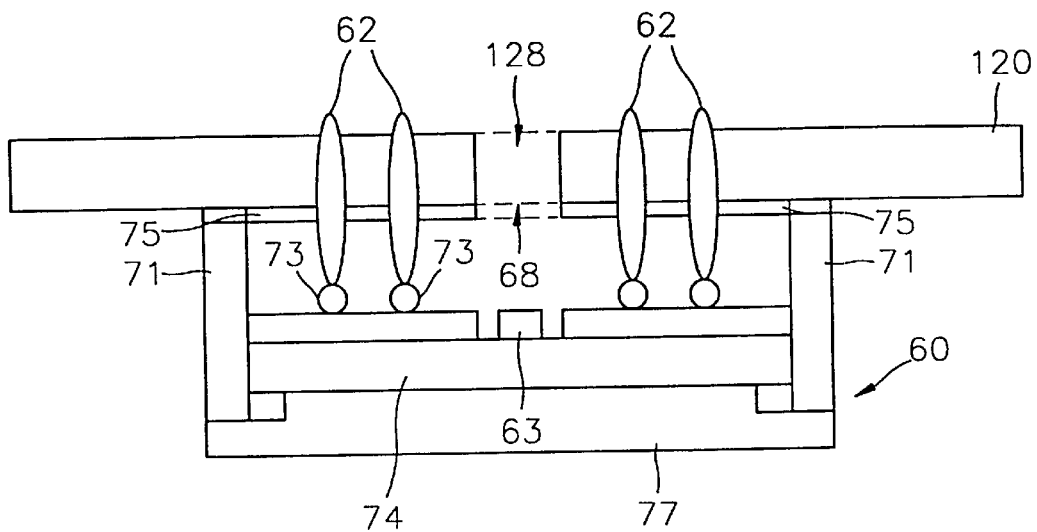
FIG. 13 is a cross-sectional view of the printed circuit board of FIG. 12 taken along line 13–13'.

FIG.12 is a top plan view of a printed circuit board (PCB) 120 according to the present invention. FIG. 13 is a cross-sectional view of the printed circuit board 120 of FIG. 12 taken along line 13–13'.

The PCB 120 includes a substrate aperture 128 (hereinafter "board aperture") formed to expose the pads 63 of the semiconductor device 74 to be tested through the socket aperture 68 of a testing socket 60. Preferably, the testing socket 60 is the testing socket 60 of FIGS. 6 through 8 according to one embodiment of the present invention or the testing socket 90 of FIGS. 9 through 11 according to another embodiment of the present invention. The socket aperture 68 of the testing socket 60 must be beneath and vertically aligned with the board aperture 128 of the PCB 120. In this structure, the pads 63 of the semiconductor device 74 to be tested are directly probed from a location above the PCB 120 through the socket aperture 68 and the board aperture 128.

Although the invention has been described with reference to particular embodiments, it will be apparent to one of ordinary skill in the art that modifications to the described embodiments may be made without departing from the spirit and scope of the invention.

For example, a testing socket has been described only with respect to pads arranged in a central configuration and in an edge configuration. However, testing sockets having apertures that can expose pads aligned in any configuration are included within the technical spirit of the present invention.

Also, as to a semiconductor device testing method according to the present invention, the order of the steps of forming a socket aperture and a board aperture can be changed.

However, the apertures must be formed in appropriate stages so that the pads of a semiconductor device to be tested are revealed.

In semiconductor device testing devices and a semiconductor device testing method according to the present invention, waveforms can be directly detected from the surface of a semiconductor device packaged by a CSP method while the semiconductor device operates.

What is claimed is:

1. A semiconductor device test set-up, comprising:

a chip-scaled package including a semiconductor device having a chip surface, a plurality of contact pads disposed on the chip surface, and a plurality of contact balls connected to the contact pads, respectively; and a test socket including a lower support member on which the semiconductor, outer sidewalls protruding upwardly from said lower support member, an upper wall disposed at the top of said outer sidewalls over said chipscaled package, and ball contact springs extending through said upper wall and into contact with the contact balls of said chip-scaled package, and wherein said upper wall has an aperture extending therethrough at a location offset from locations at which the ball contact springs pass through said upper wall, and said aperture being aligned over the pads of said chip-scaled package, whereby waveforms from the chip surface of the semiconductor device can be detected by probing said pads directly through said aperture.

2. The semiconductor device test set-up according to claim 1, wherein said outer walls are engaged with said chip-scaled package so as to position said package in the socket relative to said contact springs.

3. The semiconductor device test set-up according to claim 1, and further comprising a printed circuit board disposed on said upper wall, said contact springs being connecting to wiring of said printed circuit board, and the substrate of said printed circuit board having an aperture therethrough aligned with the aperture in said upper wall.

4. Equipment for use in testing a chip-scaled package, comprising: a lower support member on which the chip-scaled package is to rest, outer sidewalls protruding upwardly from said lower support member, an upper wall disposed at the top of said outer sidewalls and spaced from said lower support member such that the chip-scaled package can be accommodated therebetween as supported by the lower support member, and ball contact springs extending through said upper wall and downwards towards said lower support member, and wherein said upper wall has an aperture extending therethrough at a location offset from locations at which the ball contact springs pass through said upper wall, whereby waveforms from a chip surface of a semiconductor device of a chip-scaled package supported by said lower support member can be detected directly by probing the pads directly through said aperture.

5. The equipment according to claim 4, and further comprising a printed circuit board disposed on said upper wall, said contact springs being connected to wiring of said printed circuit board, and the substrate of said printed circuit board having an aperture therethrough aligned with the aperture in said upper wall.

6. A method of testing a chip-scaled package including a semiconductor device having a chip surface, a plurality of contact pads disposed on the chip surface, and a plurality of contact balls connected to the contact pads, respectively, said method comprising:

providing a test socket having a lower support member, outer sidewalls protruding upwardly from said lower support member, an upper wall disposed at the top of said outer sidewalls, and wherein said upper wall has a socket aperture extending therethrough;

inserting the chip-scaled package into the test socket such that the semiconductor device rests on the lower support member, and the socket aperture is aligned with said contact pads; and probing the exposed contact pads directly through the socket aperture to measure waveforms from the chip surface of the semiconductor device.

7. The method according to claim 6, and further comprising providing a printed circuit board having a board aperture extending through the substrate thereof; and juxtaposing the printed circuit board and the test socket so that the socket aperture is aligned with the board aperture, whereby the contact pads of the semiconductor device are exposed through the aligned socket aperture and board aperture, and wherein said probing comprises probing the exposed contact pads directly through the aligned board aperture and socket aperture.

8. The method according to claim 6, wherein the test socket has ball contact springs extending through said upper wall and downwards towards said lower support member, and said positioning of the chip-scaled package within the test socket places the ball contact springs in contact with said contact balls, and further comprising sending and receiving signals to and from the semiconductor device via said ball contact springs.

9. The method according to claim 7, wherein the test socket has ball contact springs extending through said upper wall and downwards towards said lower support member, and said positioning of the chip-scaled package within the test socket places the ball contact springs in contact with said contact balls, and further comprising sending and receiving signals to and from the semiconductor device via said ball contact springs.

* * * * *